United States Patent [19]

Ito

[11] Patent Number: 4,931,666
[45] Date of Patent: Jun. 5, 1990

[54] DARLINGTON-CONNECTED SEMICONDUCTOR DEVICE

[75] Inventor: Shinichi Ito, Kanagawa, Japan

[73] Assignee: Fuji Electric Co., Ltd., Kanagawa, Japan

[21] Appl. No.: 40,587

[22] Filed: Apr. 21, 1987

[30] Foreign Application Priority Data

Apr. 23, 1986 [JP] Japan .................................. 61-94190

[51] Int. Cl.⁵ ........................ H03K 3/33; H01L 27/02
[52] U.S. Cl. .................................... 307/315; 307/280; 307/300; 357/46
[58] Field of Search ....................... 307/315, 300, 280; 357/46; 323/289

[56] References Cited

U.S. PATENT DOCUMENTS

| | | | |
|---|---|---|---|
| 4,058,825 | 11/1977 | Bonis et al. | 307/315 |
| 4,138,690 | 2/1979 | Nawa et al. | 357/46 |
| 4,482,811 | 11/1984 | Quoirin | 357/46 |
| 4,590,395 | 5/1986 | O'Connor et al. | 307/280 |
| 4,649,297 | 3/1987 | Vazehgoo | 307/280 |

OTHER PUBLICATIONS

"Physics of Semiconductor Devices", S. M. Sze, John Wiley & Son Inc. 1987 p. 175, Copy Corp. 250.

Primary Examiner—Stanley D. Miller
Assistant Examiner—David R. Bertelson
Attorney, Agent, or Firm—Finnegan, Henderson, Farabow, Garrett and Dunner

[57] ABSTRACT

A Darlington-connected transistor circuit includes a drive stage transistor and an output stage transistor embodied in a semiconductor substrate having first and second elements in which the drive and output stage transistors are respectively disposed. The first element of the substrate has a shorter lifetime than the second substrate element, permitting higher switching speed to be achieved without affecting other characteristics of the circuit. The shorter lifetime can result from use of different semiconductor substrate materials or from selective diffusion of a lifetime killer.

4 Claims, 2 Drawing Sheets

DARLINGTON-CONNECTED SEMICONDUCTOR DEVICE

BACKGROUND OF THE INVENTION

The present invention relates to a semiconductor device and, in particular, to a device comprising Darlington-connected drive stage and output stage transistors.

A typical arrangement of a Darlington-connected transistor circuit is illustrated in FIG. 2 as including a drive stage transistor 1 coupled by its emitter to the base of an output stage transistor 2. To increase the speed of the switching operation of this circuit, a diode 3 is coupled from the base of transistor 2 to the base of transistor 1.

The switching operation of the Darlington-connected circuit of FIG. 2 is shown diagrammatically in FIG. 3, in which $I_C$ represents the output or collector current and $I_B$ represents the input or base current. The circuit of FIG. 2 has a turn-off time t defined by the period from cutoff of base current $I_B$ to the point at which output current $I_C$ becomes 0.

To improve the performance of the Darlington-connected transistor circuit, it is desirable to increase its switching speed, i.e., to decrease the duration of turn-off time t. Prior attempts to achieve this result have had negative effects on other aspects of the circuit, however. For example, where the Darlington-connected transistor circuit is formed in a single semiconductor substrate, reducing the lifetime in that substrate has affected both driver and output stage transistors 1,2 so that the current amplification factor $h_{FE}$ deteriorates. This drawback is particularly problematic when the semiconductor substrate being utilized is of a relatively large size.

SUMMARY OF THE INVENTION

It is therefore an object of the present invention to increase the switching speed of a Darlington-connected transistor circuit without negatively affecting other features of that circuit, such as current amplification factor.

A further object of the present invention is to achieve increased switching speed in a Darlington-connected transistor circuit irrespective of size of the semiconductor substrate being utilized.

Additional objects and advantages of the invention will be set forth in part in the description which follows and, in part, will be obvious from the description or may be learned by practice of the invention. The objects and advantages of the invention will be realized and attained by means of the instrumentalities and combinations particularly pointed out in the appended claims.

To achieve the objects and in accordance with the purpose of the invention, as embodied and broadly described herein, the invention includes a semiconductor device comprising a Darlington connected transistor including a drive stage transistor element and an output stage transistor element, the drive stage transistor element having a shorter lifetime than the output stage transistor element.

The accompanying drawings, which are incorporated in and constitute part of the specification, illustrate preferred embodiments of the invention and, together with the description, serve to explain the principles of the invention.

DESCRIPTION OF THE PREFERRED EMBODIMENTS

Figure 1:
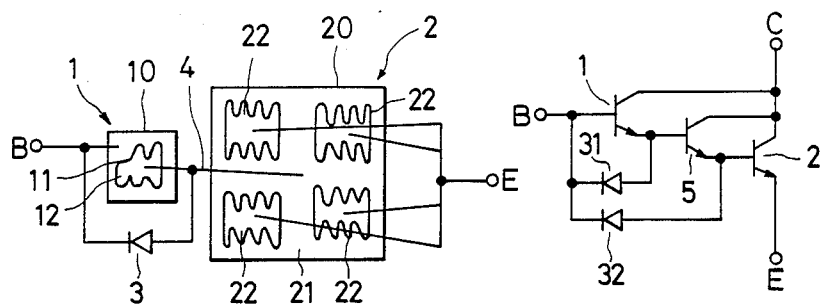
FIG. 1 is a composite top plan view of a semiconductor device in accordance with the present invention, which further shows electrical interconnections between the various elements.

Reference will now be made in detail to the presently preferred embodiments of the invention, examples of which are illustrated in the accompanying drawings. Throughout the drawings, like reference characters are used to indicate like elements.

Figure 2:
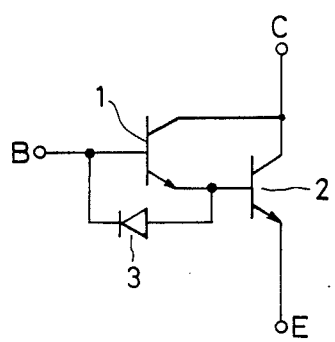
FIG. 2 is a schematic diagram of a corresponding circuit for the semiconductor device of FIG. 1.

As set forth above, the basic electrical configuration of a Darlington-connected transistor circuit, as illustrated in FIG. 2, is known. The present invention concerns embodying such a circuit in a semiconductor material so as to achieve increased switching speed without degrading other characteristics of the circuit. For purposes of understanding the present invention, reference is first made to the composite view shown in FIG. 1.

In accordance with the present invention, a semiconductor device comprises a drive stage transistor 1 and an output stage transistor 2 which is Darlington-connected to the drive stage transistor 1. In known fashion, a speed-up diode 3 can be connected between the base electrode of each of drive stage transistor 1 and output stage transistor 2. In accordance with the invention, transistors 1, 2 are consisted of the transistor elements 10, 20, the transistor element 10 having a shorter lifetime than the transistor element 20. According to the invention, a lifetime killer, such as gold, is provided in transistor element 10 so as to shorten the turn-off time of drive stage transistor 1.

To provide the various electrical interconnections schematically shown in FIG. 2, the semiconductor device illustrated in FIG. 1 includes various electrodes and wires. For example, drive stage transistor 1 includes a base electrode 11 having a base terminal B connected thereto. Driver transistor 1 further includes an emitter electrode 12. Output stage transistor 2 is provided with a base electrode 21 and a plurality of emitter electrodes 22 which are coupled together to an emitter terminal E. Base electrode 21 of the output transistor 2 is connected via a conductor 4 to emitter electrode 12 of drive stage transistor 1. Speed-up diode 3 is coupled between conductor 4 and base terminal B.

Figure 3:
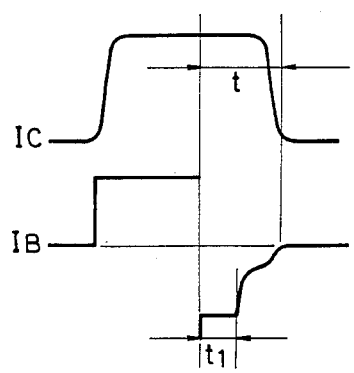
FIG. 3 is a waveform diagram of the base current and output current of the Darlington-connected transistor circuits of FIGS. 1 and 2.

The advantages of shortening the lifetime of the drive stage transistor element 10 can be understood by reference to FIG. 3. Since the lifetime in the drive stage transistor element 10 is shorter than that of the output stage transistor element 20, the turn-off time $t_1$ of the drive stage transistor 1 is reduced. This reduction in time $t_1$ results in an overall reduction in turn-off time t of the output transistor without affecting other properties of the circuit.

From the foregoing, it can be appreciated that the objects of the present invention are achieved by providing a shorter lifetime in the drive stage transistor element 10 corresponding to the drive stage transistor 1 relative to the output stage transistor element 20 corresponding to the output stage transistor 2. According to the invention, this can be accomplished in a variety of ways. For, example, drive stage transistor element 10 can be formed of a different or separate semiconductor substrate than output stage transistor element 20. The semiconductor substrate used for the two transistor elements 10, 20 can thus be selected so as to ensure a shorter lifetime in element 10 than in element 20. A lifetime killer such as gold can be introduced into the transistor element 10 so as to achieve the shorter lifetime desired in accordance with the present invention. For example, satisfactory results have been obtained by diffusing gold into the drive stage transistor element 10 at a temperature of 760° C. for thirty minutes. In this embodiment, the output stage transistor element 20 has relatively less lifetime killer diffused in it, and ideally contains no lifetime killer whatever.

Figure 7:
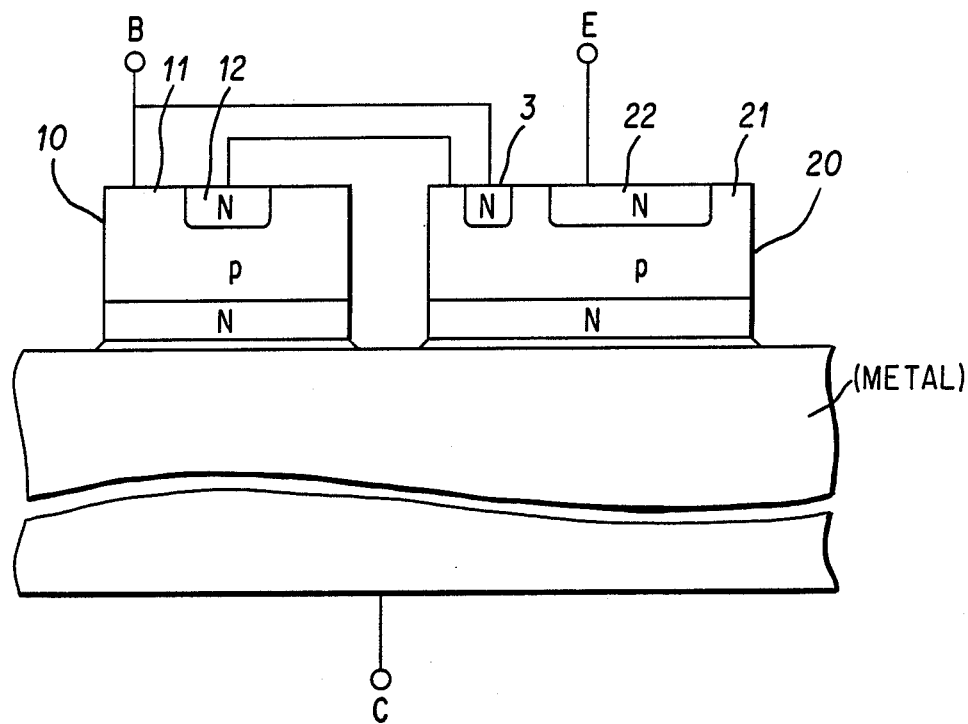
FIG. 7 is a composite side view of the semiconductor device illustrated in FIG. 1.

If the drive stage transistor is formed of a different semiconductor substrate, the need for large area of safe operation of the drive stage transistor can be reduced relative to the output stage transistor. This also can be accomplished by reducing the thickness of the high-resistance layer of the substrate of the drive stage transistor, thereby reducing its current amplification factor as well as reducing the lifetime. When separate transistor substrate materials are utilized according to the present invention, the individual substrates can be physically affixed to a common mounting metal substrate (as shown FIG. 7, and then appropriately interconnected via lead wires, e.g., wire 4. Suitable techniques for accomplishing such metal substrate mounting are known in the art and need not be discussed in further detail for purposes of explaining the present invention.

The present invention also contemplates forming transistor substrate elements 10, 20 on the identical, e.g., common, semiconductor substrate with a lifetime killer being provided only in drive stage transistor substrate element 10. Such controlled depositing of lifetime killer material can be accomplished by methods well known in the art and need not be explained further here for purposes of understanding the present invention.

Figure 4:
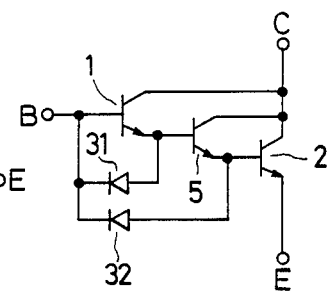
FIG. 4 is a schematic circuit diagram of a Darlington-connected transistor circuit having three stages.

FIG. 4 illustrates a three-stage Darlington-connected transistor device. This includes a drive stage transistor 1, an output stage transistor 2, and a second stage transistor 5. A pair of diodes 31, 32 are connected between the base of drive stage transistor 1 and the bases of transistors 5 and 2, respectively.

Figure 5:
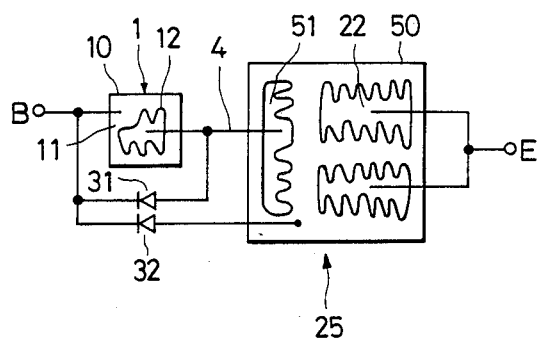
FIG. 5 is a composite top plan view of a semiconductor device embodying the circuit of FIG. 4 according to a first embodiment of the invention.

FIG. 5 shows a first embodiment of the three-stage circuit of FIG. 4 in a semiconductor material. Drive stage transistor 1 is disposed in a first semiconductor substrate element 10, and includes a base electrode 11 and an emitter electrode 12. A base terminal B is coupled to the base 11 of transistor 1.

The arrangement illustrated in FIG. 5 further includes a second substrate 50 in which is disposed second stage transistor 5 and output stage transistor 2. The latter includes emitter electrodes 22 to which are connected an electrode terminal E. Second stage transistor 5 includes a base electrode 51 which is coupled by a wire 4, which may be aluminum, for example, to emitter electrode 12 of drive stage transistor 1. Diodes 31, 32 are coupled between the base electrode 11 and the bases of transistors 5 and 2, respectively.

According to the present invention, a lifetime killer can be introduced into drive stage transistor substrate 10 so as to improve the turn-off time of drive stage transistor 1. In this manner, the overall switching speed of the Darlington-connected circuit can be improved without affecting any other characteristics, such as the amplification factor of output transistor 2. As described above with respect to FIG. 1, transistor substrate 10 and 50 can either be formed separately on a common mounting metal substrate or may be formed of the same semiconductor substrate on a common mounting metal substrate (not shown), with the life time killer being controlled accordingly.

Figure 6:
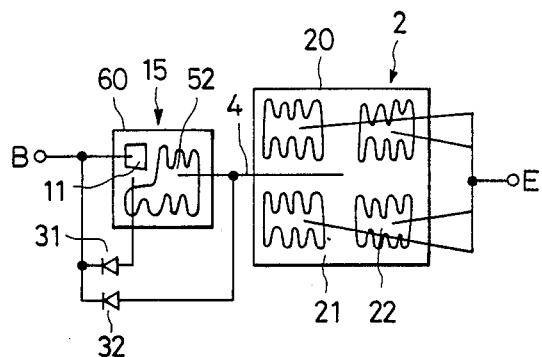
FIG. 6 is a composite top plan view of a semiconductor device embodying the circuit of FIG. 4 according to a second embodiment of the present invention.

FIG. 6 illustrates a second embodiment of the three-stage transistor circuit of FIG. 4 provided in a semiconductor material in accordance with the present invention. In this alternate embodiment, drive stage transistor 1 and second stage transistor 5 are provided on the same semiconductor substrate element 60, whereas output stage transistor 2 is formed of a semiconductor substrate element 20. Transistor 5 is provided with an emitter electrode 52 coupled via wire 4 to the base electrode 21 of transistor 2 and to diode 32. In other respects, the layout illustrated in FIG. 6 can be understood from the foregoing description regarding FIGS. 4 and 5.

According to the invention, the lifetime of the substrate in which drive transistor 1 is disposed is shorter than that of the substrate in which output transistor 2 is disposed. This may be achieved via a lifetime killer that is introduced into substrate element 60. The lifetime killer can be provided throughout the whole of substrate 60 or only in that area corresponding to placement of drive stage transistor 1. Accordingly, substrates 10, 10 and 60 in FIGS. 1, 5 and 6 respectively comprise substrates using gold diffusion, while substrates 20, 50 and 20 respectively comprise substrates without gold diffusion. Substrate element 20 and 60 can be formed of a common semiconductor substrate or different semiconductor substrate may be used as described previously.

It should be appreciated from the foregoing that the present invention can also be applied to Darlington-connected semiconductor devices having four or more stages.

By providing a lifetime in the substrate corresponding to the drive stage transistor that is shorter than the lifetime of the substrate corresponding to the output stage transistor, the present invention permits increased switching speed to be achieved in a Darlington-connected circuit without impairing any other operating characteristics. The difference in lifetime can be accomplished whether the two substrate are different in nature or are formed on a common or identical substrate material. In the latter case, a lifetime killer is selectively introduced into elements corresponding to the drive stage transistor whereas in the former case, either a lifetime killer can be used or different substrate materials can be employed to achieve the desired difference in lifetime characteristics.

Other embodiments of the invention will be apparent to those skilled in the art from consideration of the specification and practice of the invention disclosed herein. Thus, it is intended that the specification and drawings be considered as exemplary only, with the true scope and spirit of the invention being indicated by the following claims.

What is claimed is:

1. A semiconductor device comprising:
   a Darlington connected transistor including a drive stage transistor element and an output stage transistor element Darlington-connected to said drive stage transistor element,
   said drive stage transistor element having a shorter lifetime than said output stage transistor element for increasing switching speed of said Darlington-connected transistor,
   wherein said drive stage and said output stage transistor elements are formed on different semiconductor substrates.

2. The semiconductor device according to claim 1, wherein said drive stage transistor element includes a lifetime killer.

3. A semiconductor device comprising:
   a Darlington connected transistor including a drive stage transistor element and an output stage transistor element Darlington-connected to said drive stage transistor element,
   said drive stage transistor element having a shorter lifetime than said output stage transistor element for increasing switching speed of said Darlington-connected transistor,
   wherein said drive stage transistor element includes a lifetime killer.

4. The semiconductor device according to claim 3, wherein said drive stage and said output stage transistor elements are formed of a common semiconductor substrate.

* * * * *